(12) United States Patent
Mikami et al.

(10) Patent No.: US 8,740,377 B2
(45) Date of Patent: Jun. 3, 2014

(54) IMPRINT RECIPE CREATING DEVICE AND IMPRINT DEVICE

(75) Inventors: Shinji Mikami, Kawasaki (JP); Ryoichi Inanami, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 183 days.

(21) Appl. No.: 13/177,763

(22) Filed: Jul. 7, 2011

(65) Prior Publication Data
US 2012/0050441 A1   Mar. 1, 2012

(30) Foreign Application Priority Data

Aug. 31, 2010  (JP) ................. 2010-194231

(51) Int. Cl.
*B41J 2/01*  (2006.01)
*B41J 2/00*  (2006.01)

(52) U.S. Cl.
USPC ........................................... 347/104

(58) Field of Classification Search
USPC ........................................... 347/110
See application file for complete search history.

(56) References Cited

U.S. PATENT DOCUMENTS

| 7,856,288 | B2 | 12/2010 | Yoneda et al. | |
|---|---|---|---|---|
| 2002/0041368 | A1* | 4/2002 | Ota et al. | 355/55 |
| 2007/0038531 | A1* | 2/2007 | Lukis et al. | 705/26 |
| 2007/0278712 | A1 | 12/2007 | Okushima et al. | |
| 2008/0003827 | A1* | 1/2008 | Dijksman et al. | 438/690 |
| 2009/0267268 | A1* | 10/2009 | Yoneda et al. | 264/319 |
| 2010/0079518 | A1* | 4/2010 | Yamazaki | 347/9 |
| 2011/0066273 | A1 | 3/2011 | Yoneda et al. | |

FOREIGN PATENT DOCUMENTS

| JP | 2005-286062 | 10/2005 |
|---|---|---|
| JP | 2007-320098 | 12/2007 |
| JP | 2009-88376 | 4/2009 |

\* cited by examiner

*Primary Examiner* — Stephen Meier
*Assistant Examiner* — Alexander C Witkowski
(74) *Attorney, Agent, or Firm* — Finnegan, Henderson, Farabow, Garrett & Dunner, L.L.P.

(57) ABSTRACT

Certain embodiments provide an imprint recipe creating device comprising first to fifth creation units. The first creation unit creates inside-standard-shot information by use of filling amount information and residual film thickness information. The second creation unit creates first inside-substrate-surface information by use of shot position information, edge information, and the inside-standard-shot information. The third creation unit creates first correction information by use of unevenness information indicating unevenness in a substrate and unevenness distribution information indicating variations in depth of the unevenness inside the substrate surface. The fourth creation unit creates second correction information by use of post-process information indicating the variations in processing size. The fifth creation unit synthesizes the first inside-substrate-surface information, the first correction information and the second correction information, to create second inside-substrate-surface information.

4 Claims, 12 Drawing Sheets

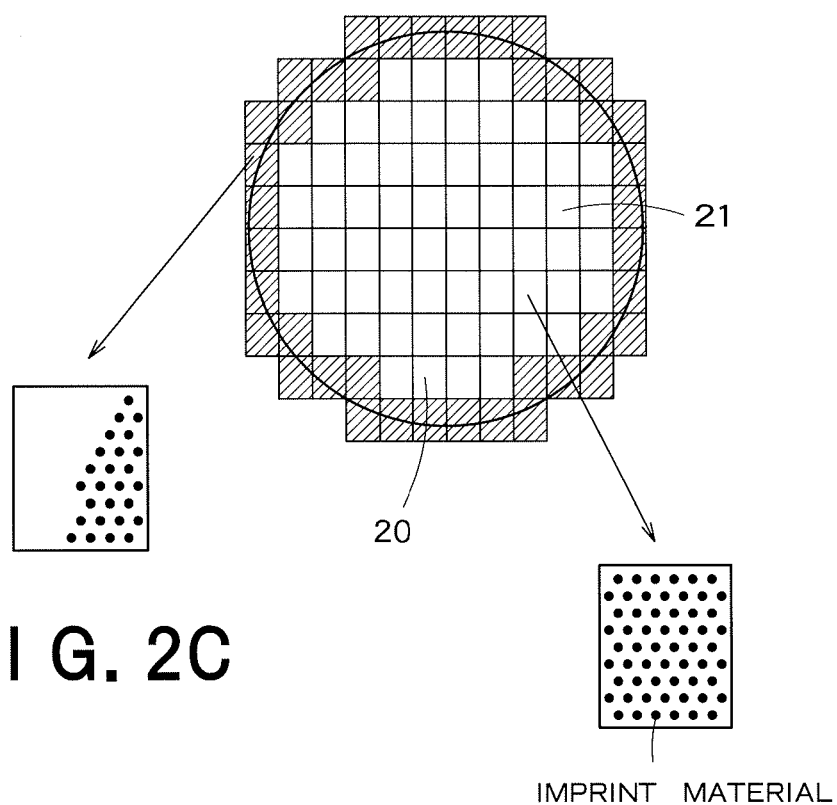

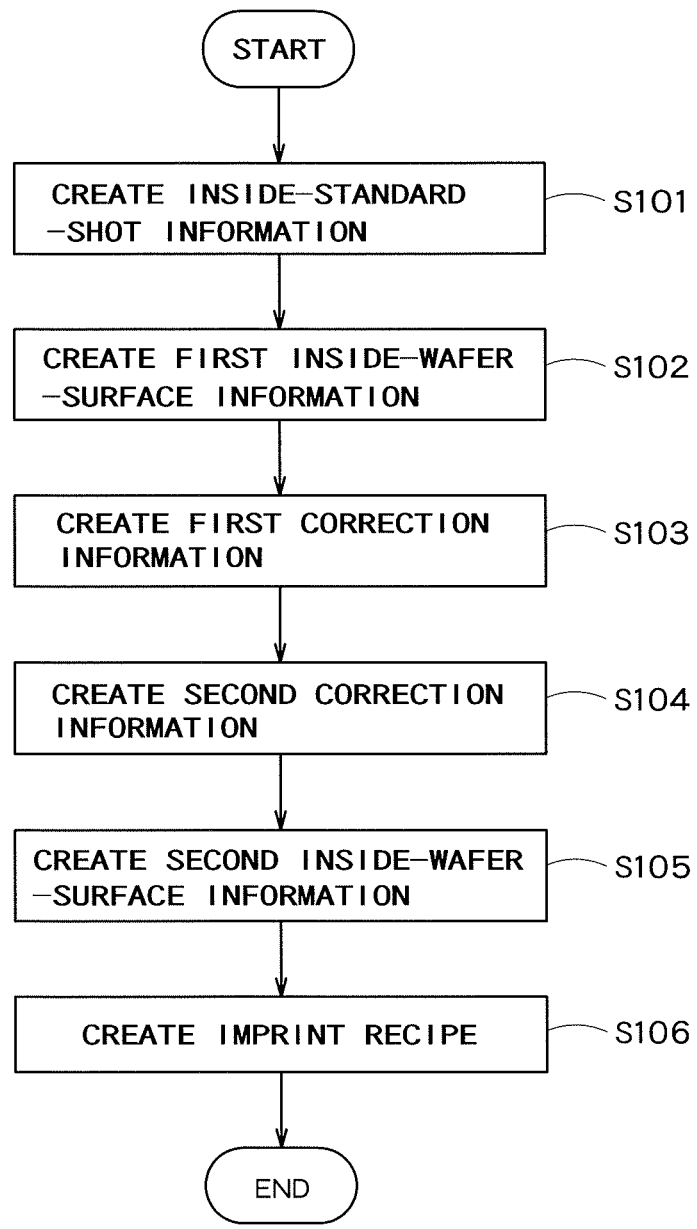
F I G. 5

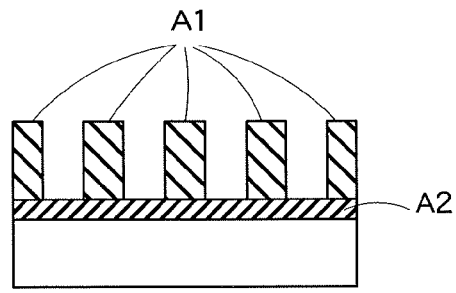
F I G. 6
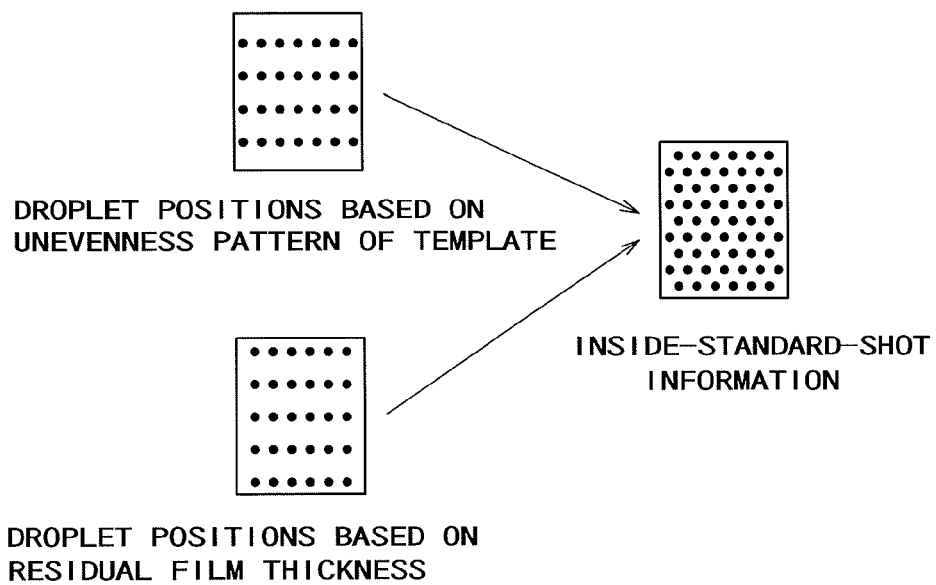
F I G. 7

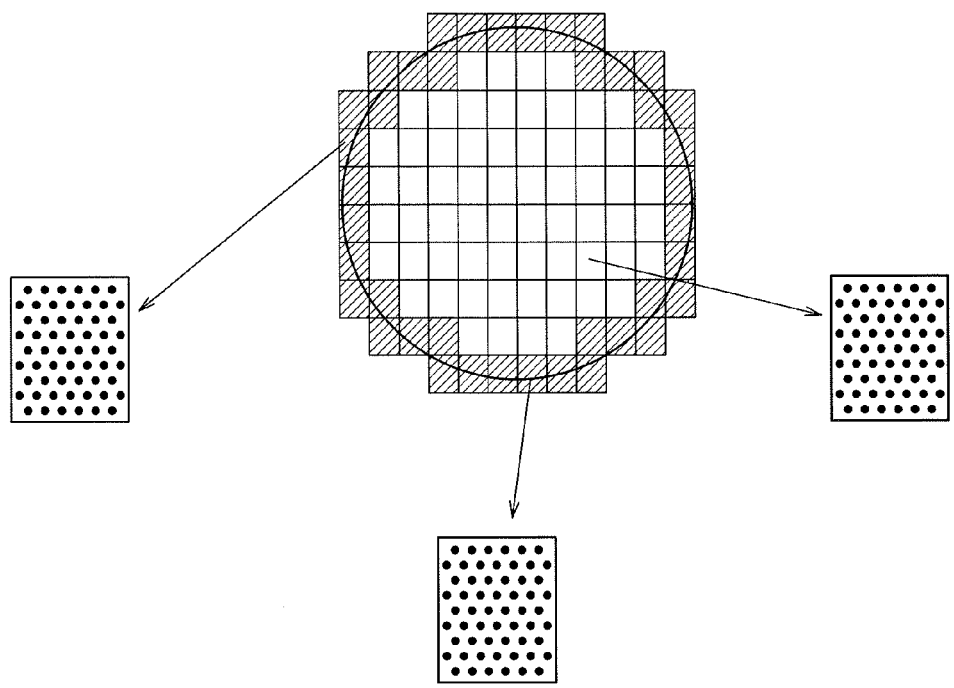
F I G. 8A
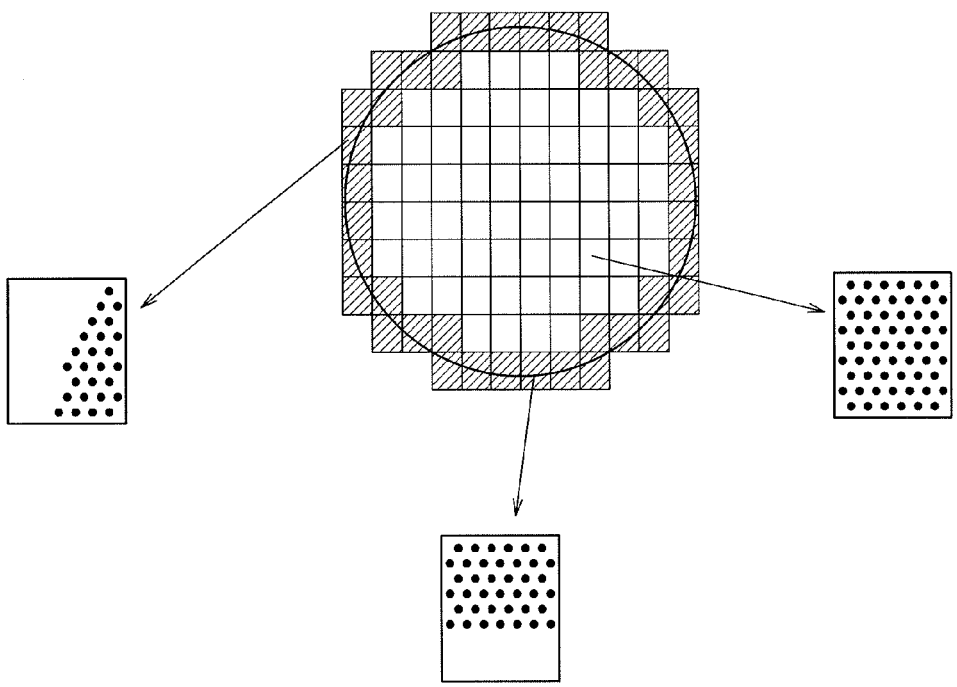
F I G. 8B

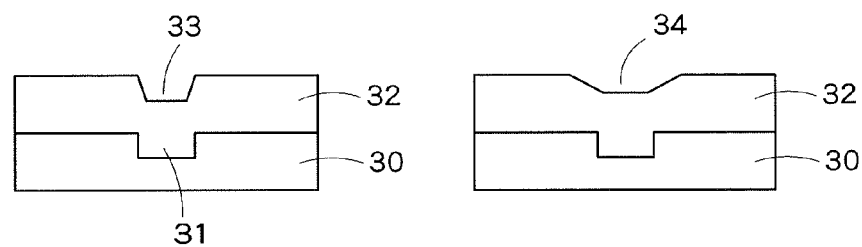
F I G. 9A  F I G. 9B
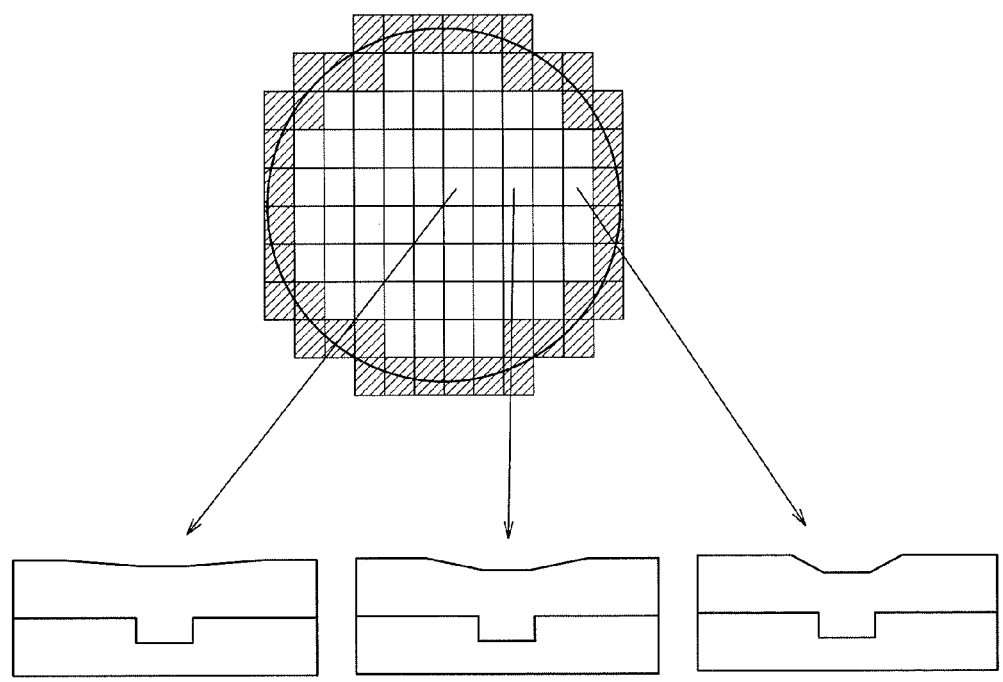
F I G. 10

IMPRINT RECIPE CREATING DEVICE AND IMPRINT DEVICE

CROSS REFERENCE TO RELATED APPLICATIONS

This application is based upon and claims the benefit of priority from the prior Japanese Patent Application No. 2010-194231, filed on Aug. 31, 2010, the entire contents of which are incorporated herein by reference.

FIELD

Embodiments described herein relate generally to an imprint recipe creating device and an imprint device.

BACKGROUND

As a technique for realizing both formation of a fine pattern not larger than 100 nm and mass productivity in a manufacturing process of a semiconductor element, attention has been focused on a nanoimprint method. In the nanoimprint method, a template having unevenness (concave-convex) corresponding to a pattern desired to be formed on a substrate is pressed to an imprint material which has been applied to the surface of the substrate to be transferred and has photo curability, and held until the imprint material permeates inside the unevenness pattern. Thereafter, application of light is performed, to cure the imprint material, and the template is released from the imprint material, to obtain a desired pattern.

The imprint material is applied to the substrate by ink-jetting with reference to each one shot based on an imprint recipe (information of droplet positions of the imprint material). At the time of pressing the template to the imprint material, it is necessary to create the imprint recipe in view of a variety of information, such as a position and a shape of a partial shot and distortion of the substrate, so as not to cause deficiency and excess of the imprint material. There has thus been a problem of it taking time to create the imprint recipe.

BRIEF DESCRIPTION OF THE DRAWINGS

FIG. 2A is a view showing a shot area on a wafer;

FIG. 2B is a view illustrating a droplet position of an imprint material in a shot area;

FIG. 2C is a view illustrating a droplet position of an imprint material in a shot area;

FIG. 5 is a flowchart illustrating an imprint recipe creating method according to the first embodiment;

FIG. 6 is a view showing an imprint material that fills an unevenness pattern of a template and a residual film;

FIG. 7 is a view showing an example of inside-standard-shot information laid in each shot area;

FIG. 8A is a view showing the inside-standard-shot information;

FIG. 8B is a view showing an example of first inside-wafer-surface information;

FIGS. 9A and 9B are views showing unevenness of a substrate;

FIG. 10 is a view showing variations in unevenness of a substrate inside a wafer surface;

DETAILED DESCRIPTION

Certain embodiments provide an imprint recipe creating device, comprising a first creation unit which creates inside-standard-shot information indicating droplet positions of an imprint material in a shot area corresponding to one shot of imprinting, a second creation unit which creates first inside-wafer-surface information indicating droplet positions of the imprint material inside a wafer surface, a third creation unit which creates first correction information indicating droplet positions of the imprint material for correcting unevenness generated in a substrate of the shot area inside the wafer surface, a fourth creation unit which creates second correction information indicating droplet positions of the imprint material for correcting variations in processing size in processing after the imprint process inside the wafer surface, and a fifth creation unit which creates second inside-wafer-surface information.

The first creation unit creates the inside-standard-shot information by use of filling amount information indicating an amount of the imprint material that fills depressed portions of a template and a residual film thickness information indicating a film thickness of a residual film that is formed on a wafer. The second creation unit creates the first inside-wafer-surface information by use of shot position information indicating a position at which a shot of imprinting is performed inside the wafer surface, edge information indicating an edge of the wafer, and the inside-standard-shot information. The third creation unit creates the first correction information by use of unevenness information indicating the unevenness, and unevenness distribution information indicating variations in depth of the unevenness inside the wafer surface. The fourth creation unit creates the second correction information by use of post-process information indicating the variations in processing size. The fifth creation unit synthesizes the first inside-wafer-surface information, the first correction information and the second correction information, to create the second inside-wafer-surface information.

Hereinafter, embodiments of the present invention will be described with reference to the drawings.

First Embodiment

Figure 1A:
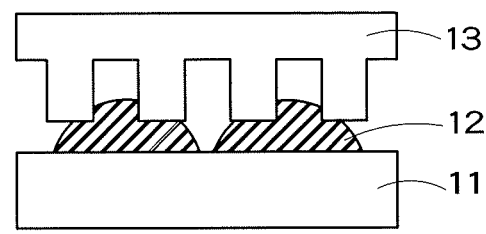
FIGS. 1A-1D are process sectional views illustrating an imprint method.

First, an imprint method will be described. In the imprint method, as shown in FIG. 1A, an imprint material 12 is applied onto a substrate 11 based on an after-mentioned imprint recipe. Then, a template 13 having unevenness corresponding to a pattern to be formed is brought into contact with the applied imprint material 12. The imprint material 12 is a liquid photo-curable organic material, such as an acrylic monomer.

Figure 1B:
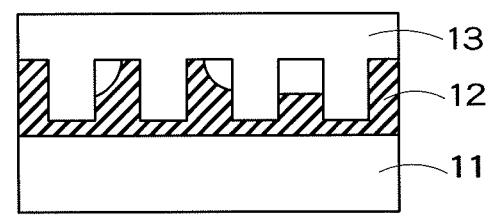

As shown in FIG. 1B, the liquid imprint material 12 flows in accordance with the unevenness pattern of the template 13 and gets thereinto.

Figure 1C:
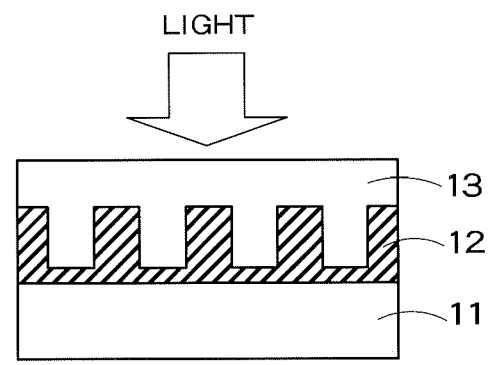

As shown in FIG. 1C, after filling of the inside of the unevenness pattern with the imprint material 12, light is applied, to cure the imprint material 12. The applied light may be one that cures the imprint material 12, and lump light or the like may, for example, be used. The template 13 is formed of such a material as to allow this light therethrough, such as quartz glass.

Figure 1D:
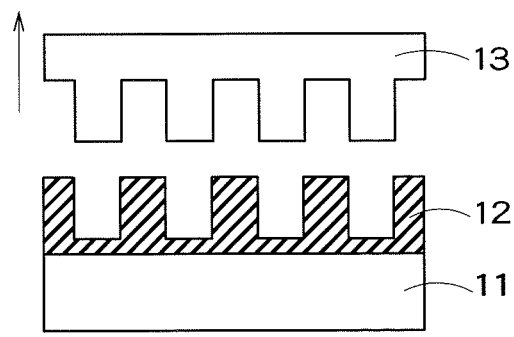

As shown in FIG. 1D, the template 13 is separated from the imprint material 12. Since the imprint material 12 has already been cured in this state, it is kept in a state (form) where the template 13 was in contact.

The steps shown in FIGS. 1A to 1D are repeated, to form a plurality of imprint materials having a desired unevenness pattern on the substrate.

For example, as shown in FIG. 2A, a substrate (for example, wafer) 20 is divided into shot areas 21 in each of which one shot of imprinting is performed, and the steps shown in FIGS. 1A to 1D are implemented in each shot area 21. The shot area 21 has a size equivalent to that of the template 13. The shot area 21 in an edge portion of the wafer 20 is a partial shot where part of the template 13 lies off the wafer 20. The shot area 21 as the partial shot is shaded in FIG. 2A.

As shown in FIGS. 2B, 2C, the imprint material 12 is applied to a plurality of positions in each shot area 21. An imprint recipe is information defining where to apply (drop) the imprint material 12 with regard to each of the all the shot areas 21 of the wafer 20.

Figure 3:
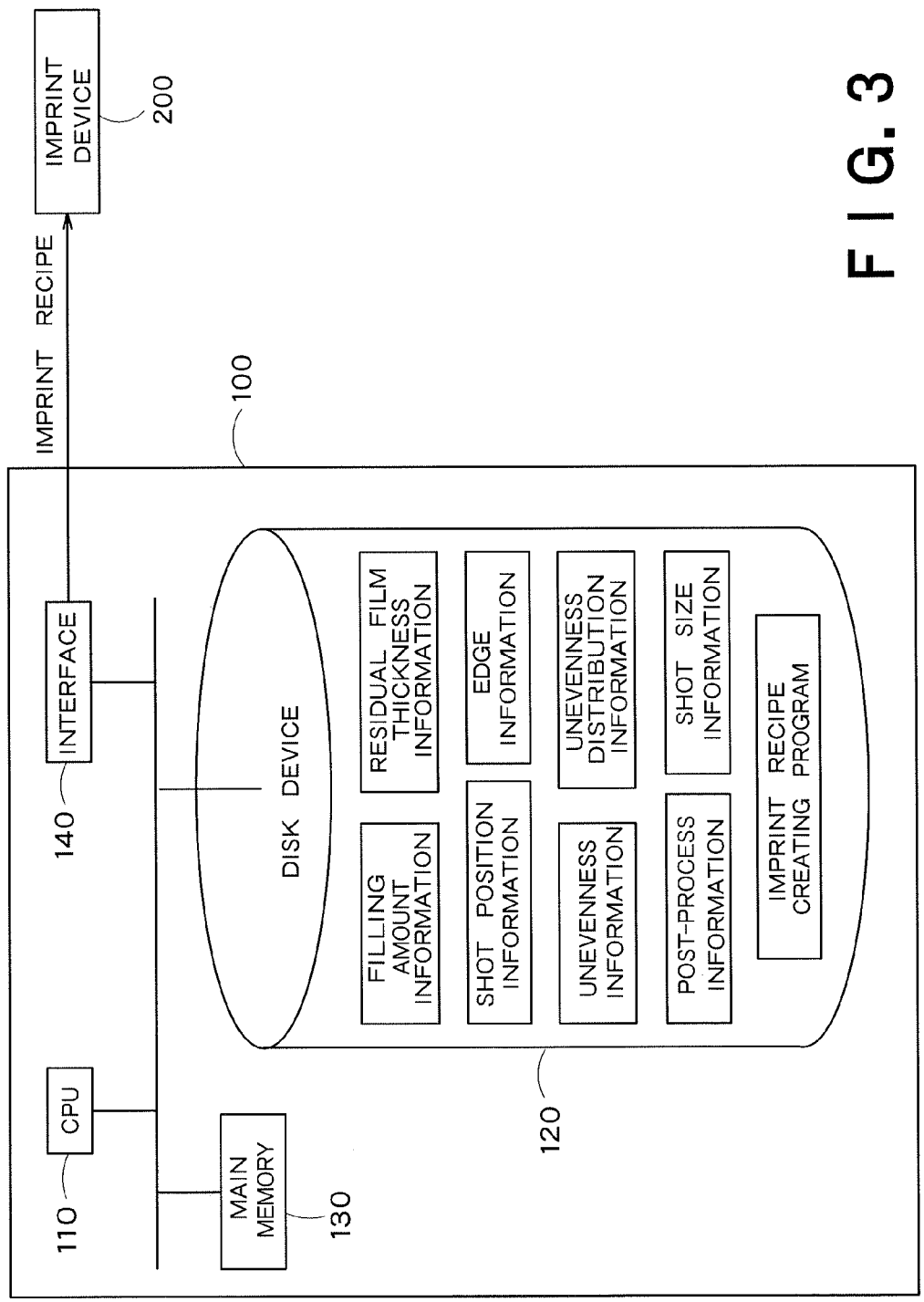
FIG. 3 is a hardware configuration diagram of an imprint recipe creating device according to a first embodiment of the present invention.

FIG. 3 shows a hardware configuration of an imprint recipe creating device 100 according to the present embodiment. The imprint recipe creating device 100 includes a CPU (central processing unit) 110, a disk device (hard disk drive) 120, a main memory 130 and an interface 140. Each unit of the imprint recipe creating device 100 is connected through a bus.

The disk device 120 stores a variety of information for use in creation of the imprint recipe. Specifically, the disk device 120 stores filling amount information, residual film thickness information, shot position information, edge information, unevenness information, unevenness distribution information, post-process information, and shot size information. Details of respective information will be described later.

Further, the disk device 120 stores an imprint recipe creating program to be executed by the CPU 110.

The CPU 110 loads the imprint recipe creating program inside the disk device 120 to the main memory 130, to execute the imprint recipe creating program. At this time, the respective information (filling amount information, residual film thickness information, shot position information, edge information, unevenness information, unevenness distribution information, post-process information, and shot size information) inside the disk device 120 may also be loaded to the main memory 130.

Figure 4:
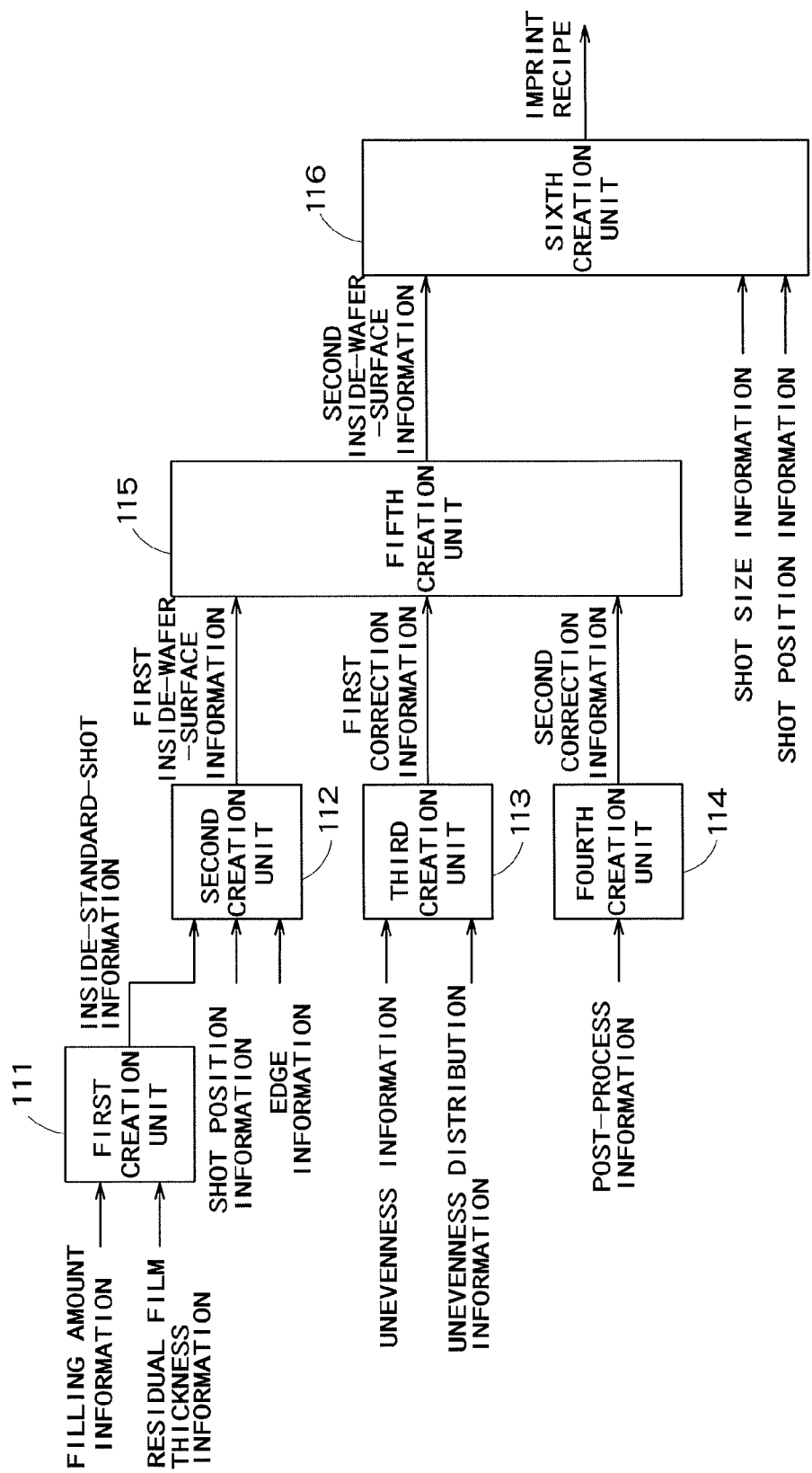
FIG. 4 is a function block diagram of the imprint recipe creating device according to the first embodiment.

FIG. 4 is a function block diagram that is realized by the CPU 110 executing the imprint recipe creating program. By execution of the imprint recipe creating program, a first creation unit 111 which creates inside-standard-shot information, a second creation unit 112 which creates first inside-wafer-surface information (first inside-substrate-surface information), a third creation unit 113 which creates first correction information, a fourth creation unit 114 which creates second correction information, a fifth creation unit 115 which creates second inside-wafer-surface information (second inside-substrate-surface information), and a sixth creation unit 116 which creates an imprint recipe. The inside-standard-shot information, the first inside-wafer-surface information, the second inside-wafer-surface information, the first correction information and the second correction information will be described later.

Processing that are performed in the first creation unit 111, the second creation unit 112, the third creation unit 113, the fourth creation unit 114, the fifth creation unit 115 and the sixth creation unit 116 will be described along with a flowchart shown in FIG. 5.

(Step S101)

The first creation unit 111 creates the inside-standard-shot information by use of the filling amount information and the residual film thickness information.

Herein, the filling amount information is information indicating an amount of the imprint material that fills the inside of the unevenness pattern of the template at the time of performing a shot of imprinting. The residual film thickness information is information indicating a thickness of a residual film for preventing the template from directly coming into contact with the substrate. Further, the inside-standard-shot information is information indicating droplet (applied) positions of the imprint material in an area (shot area) corresponding to one shot of imprinting.

For example, implementing the steps shown in FIGS. 1A to 1D leads to formation of a pattern as shown in FIG. 6. In FIG. 6, an area A1 corresponds to the imprint material that fills the unevenness patterns of the template, and an area A2 corresponds to the residual film.

Therefore, the first creation unit 111 obtains droplet positions (a droplet amount) of the imprint material which is required for filling the inside of the unevenness pattern of the template. For example, in the area corresponding to the depressed portions of the template, the droplet positions of the imprint material are made dense (the number of droplet places is made large), to make the droplet amount large. Further, the first creation unit 111 obtains droplet positions (a droplet amount) of the imprint material which is required for forming the residual film. Then, as shown in FIG. 7, the first creation unit 111 synthesizes (adds) these two types of droplet positions, to create the inside-standard-shot information.

(Step S102)

The second creation unit 112 creates the first inside-wafer-surface information based on the shot position information, the edge information, and the inside-standard-shot information created in Step S101.

Herein, the shot position information is information showing a position where a shot of imprinting is performed on the wafer. For example, the shot position information is information indicating a position (coordinate) of the center of each shot area 21 in FIG. 2A.

Further, the edge information is information indicating an edge of the wafer. The edge information is information required for preventing the imprint material from being dropped to the outside of the edge of the wafer. Further, the first inside-wafer-surface information is information indicating droplet positions of the imprint material across the wafer surface.

From the shot position information and the edge information, the second creation unit 112 discriminates between a shot area being the partial shot and a shot area not being the partial shot. The second creation unit 112 then corrects the inside-standard-shot information with regard to the short area as the partial shot such that the imprint material is not dropped to the outside of the edge of the wafer, to create the first inside-wafer-surface information.

Specifically, as shown in FIG. 8A, the second creation unit 112 first lays the inside-standard-shot information in each shot area. Then, as shown in FIG. 8B, the second creation unit 112 corrects the inside-standard-shot information with regard to the short area as the partial shot such that the imprint material is not dropped to the outside of the edge of the wafer. In this manner, the first inside-wafer-surface information indicating the droplet positions of the imprint material across the inside of the wafer surface can be created.
(Step S103)

The third creation unit 113 creates first correction information by use of the unevenness information and the unevenness distribution information.

Herein, the unevenness information is information indicating unevenness generated in each shot area by a process before the imprint process.

For example, as shown in FIG. 9A, when a processed film 32 is deposited on a substrate (wafer) 30 where a depressed portion 31 is formed, a depressed portion 33 is also formed on the processed film 32 in association with the depressed portion 31 of the substrate 30. When CMP (chemical-mechanical polishing) processing is performed on such surface of the processed film 32, as shown in FIG. 9B, the flatness of the processed film 32 improves, but a depressed portion 34 is present. The imprint material is dropped onto this processed film 32, for performing imprinting. The unevenness information includes information about the position of this depressed portion 34.

The unevenness distribution information indicates how the unevenness information changes (varies) depending on the position inside the wafer surface. For example, when the depressed portion 34 shown in FIG. 9B becomes deeper as its position gets farther away from the center of the wafer (closer to the edge) as shown in FIG. 10, such changes (variations) are included in the unevenness distribution information.

The third creation unit 113 creates the first correction information indicating such droplet positions of the imprint material as to correct varied unevenness inside the wafer surface by use of the unevenness information and unevenness distribution information as described above.

For example, in the examples shown in FIGS. 9 and 10, the first correction information is created in which droplet positions of the imprint material are set in positions corresponding to the depressed portions 34. This is because a further imprint material is required for filling the depressed portions 34 than in the other area. It is to be noted that in this example, as the position gets farther away from the center of the wafer, the more imprint material is required for filling the depressed portion 34, and the number of applied positions is made larger (the applied positions are made denser).
(Step S104)

The fourth creation unit 114 creates the second correction information by use of the post-process information.

Figure 11:
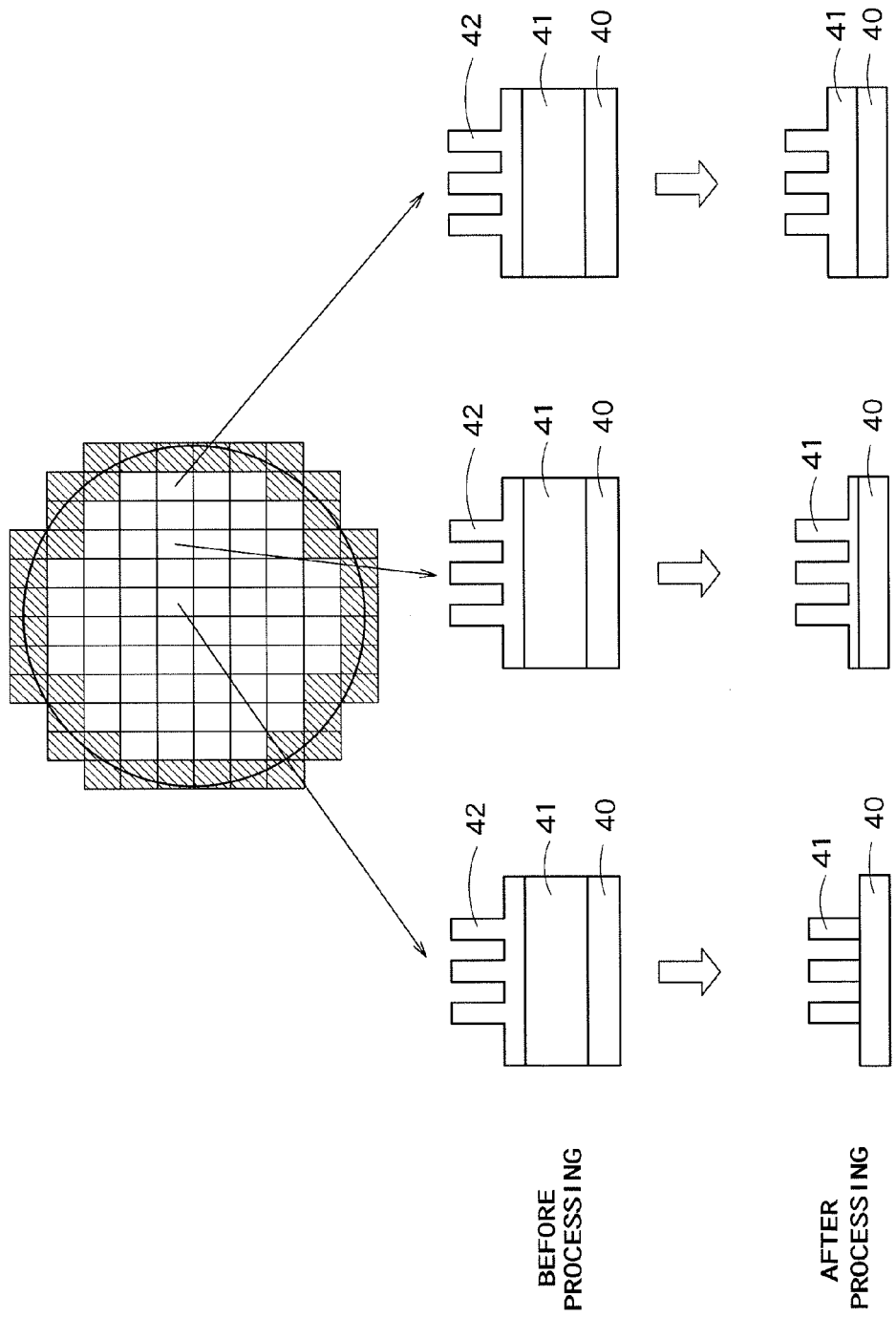
FIG. 11 is a view showing variations in processing size of post-process processing.

Herein, the post-process information includes information of variations (distribution) in processing size in the processing process (post-process) implemented after the imprint process inside the wafer surface. For example, as shown in FIG. 11, a pattern of an imprint material 42, formed by the imprint process, is formed on a processed film 41. When processing by means of RIE (reactive ion etching) is performed with the pattern of the imprint material 42 used as a mask, there can occur such variations (distribution) in processing size that a reduced amount of the processed film 41 decreases as its position gets farther away from the center of a wafer 40 inside the surface of the wafer 40. The post-process information includes such a characteristic of the post process. The post-process information is previously obtained by an experiment.

Then, by use of the post-process information, the fourth creation unit 114 creates the second correction information indicating such droplet positions of the imprint material as to correct variations (distribution) in processing size in the post-process processing.

Figure 12:
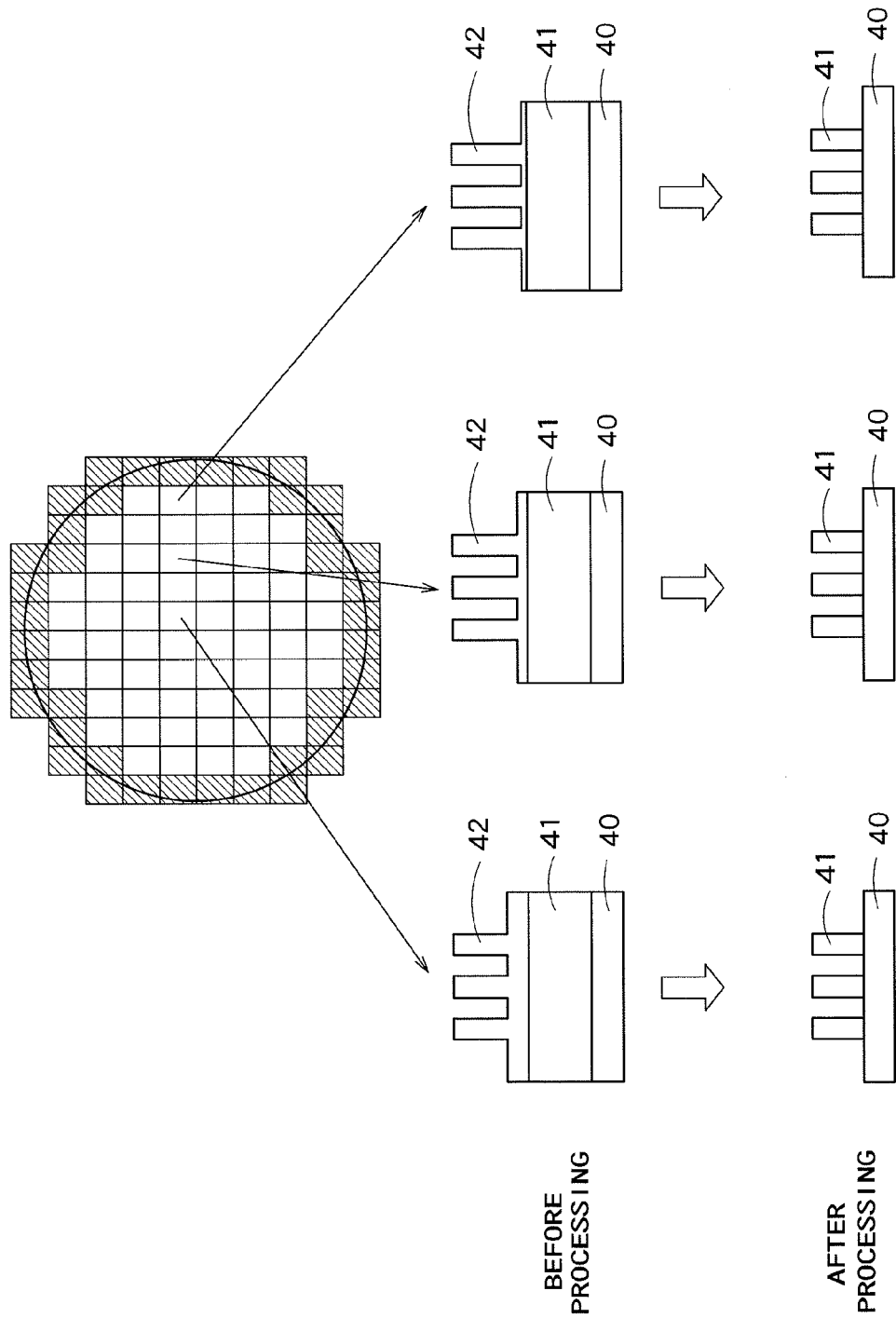
FIG. 12 is a view showing an example of a residual film thickness inside the wafer surface.

For example, in the case of the post-process information including variations in processed size as shown in FIG. 11, the fourth creation unit 114 creates the second correction information that corrects the droplet positions of the imprint material such that the thickness of the residual film decreases as its position gets farther away from the center of the wafer. By reduction in thickness of the residual film as its position gets farther away from the center of the wafer, the variations in processed size due to the post-process (RIE) can be corrected so as to obtain a uniform processing pattern inside the wafer surface, as shown in FIG. 12.

It is to be noted that the processing in Steps S102, S103, S104 may be performed in any order.
(Step S105)

The fifth creation unit 115 creates the second inside-wafer-surface information by use of the first inside-wafer-surface information, the first correction information and the second correction information.

As described above, the first inside-wafer-surface information is information indicating droplet positions of the imprint material across the wafer surface. The first correction information is information indicating such droplet positions of the imprint material as to correct unevenness generated on the substrate by the process before the imprint process. The second correction information is information indicating such droplet positions of the imprint material as to correct variations (distribution) in processing size inside the wafer surface, generated by the processing process after the imprint process.

The fifth creation unit 115 synthesizes (adds) the first inside-wafer-surface information, the first correction information and the second correction information, to create the second inside-wafer-surface information That is, the second inside-wafer-surface information is information indicating droplet positions of the imprint material across the wafer surface in view of the correction of the unevenness of the substrate, generated before the imprinting, and the correction of variation in processed size, generated after the imprinting.
(Step S106)

The sixth creation unit 116 creates an imprint recipe by use of the second inside-wafer-surface information, the shot size information and the shot position information.

Herein, the shot size information is information indicating a size of one shot, namely a size of the template. As described above, the shot position information is information indicating a position at which a shot of imprinting is performed on the wafer. Therefore, the sixth creation unit 116 can obtain a range of each shot area on the wafer based on the shot size information and the shot position information.

The sixth creation unit 116 can carve the second inside-wafer-surface information by use of the range of each shot area, so as to collectively create an imprint recipe with regard to every shot inside the wafer surface.

As described above, the imprint recipe created by the imprint recipe creating device 100 is given to an imprint device 200 (see FIG. 3). The imprint device 200 can, for example, receive the imprint recipe from the imprint recipe creating device 100 through a cable or wireless network. The imprint device 200 applies the imprint material based on the imprint recipe, brings the template into contact therewith, applies light and releases the template, to form a pattern (see FIGS. 1A to 1D).

In this manner, according to the present embodiment, it is possible to collectively create the imprint recipe with regard to every shot inside the wafer surface by use of the filling amount information, the residual film thickness information, the shot position information, the edge information, the unevenness information, the unevenness distribution information, the post-process information, and the shot size information in view of the unevenness of the substrate, generated before the imprinting, and the variations in processed size, generated after the imprinting. Since there is no need for creating the imprint recipe with respect to each shot, the time for creating the imprint recipe can be reduced.

In the above embodiment, in creation of the first inside-wafer-surface information, the unevenness information may further be used in addition to the inside-standard-shot information, the shot position information and the edge information. In this case, the first inside-wafer-surface information is created in view of the unevenness of the substrate. Further, the first correction information is information created based on the unevenness distribution information and indicates an applied position of the imprint material for correcting variations in unevenness.

Moreover, the processing of Steps S101 to S105 of the flowchart shown in FIG. 5 may be performed in the imprint recipe creating device 100, and the second inside-wafer-surface information, the shot size information and the shot position information may be passed to the imprint device 200 provided with the function of the sixth creation unit 116, so that the processing of Step S106 may be performed in the imprint device 200.

Second Embodiment

Figure 13:
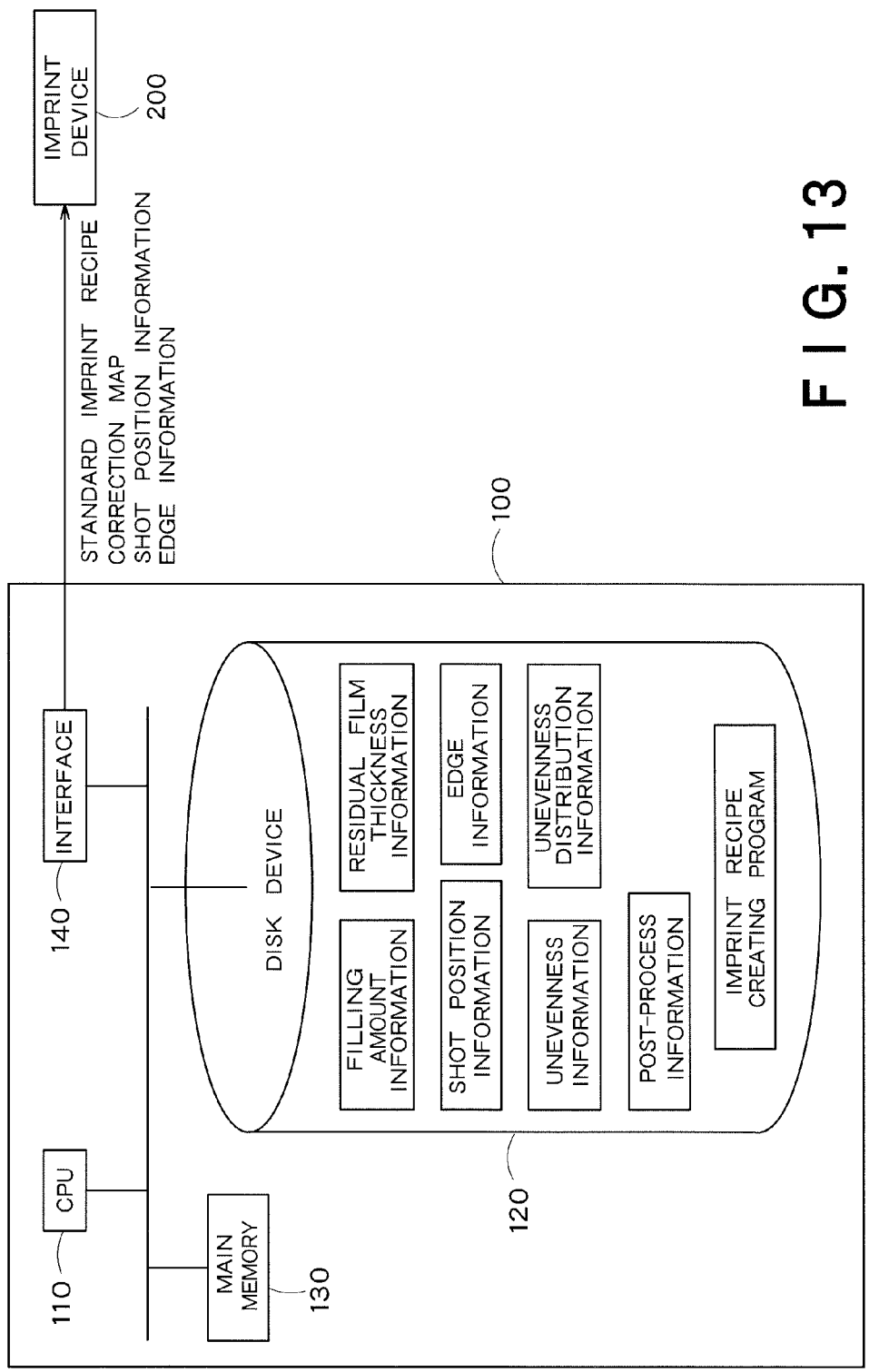
FIG. 13 is a hardware configuration diagram of an imprint recipe creating device according to a second embodiment of the present invention.

FIG. 13 shows a hardware configuration of an imprint recipe creating device 100 according to a second embodiment of the present invention. Since the hardware configuration is as in the above first embodiment shown in FIG. 3, a description thereof will not be repeated here. Further, since aftermentioned filling amount information, residual film thickness information, shot position information, edge information, unevenness information, unevenness distribution information, post-process information, and inside-standard-shot information are as in the above first embodiment, descriptions thereof will not be repeated here.

Figure 14:
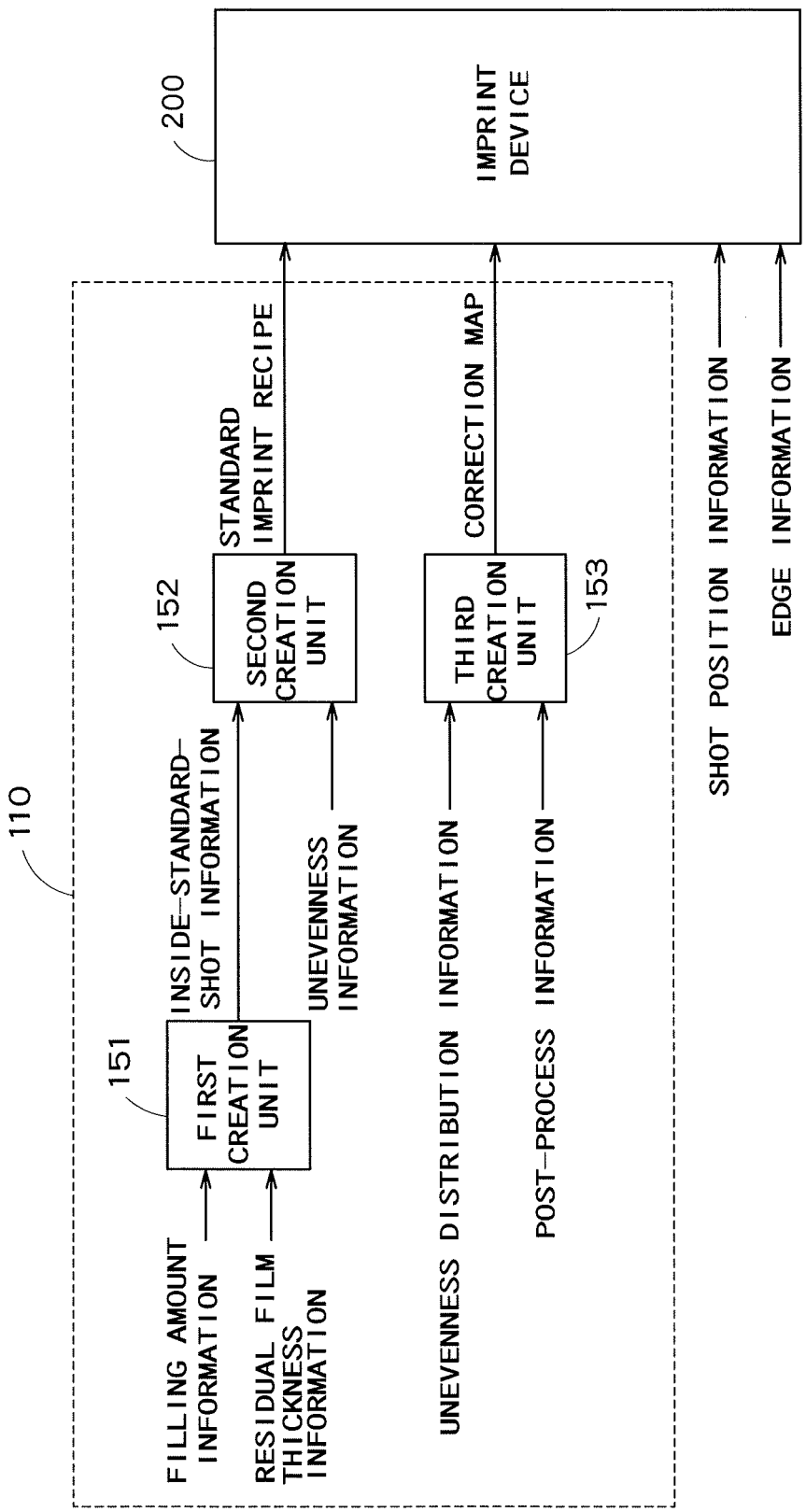
FIG. 14 is a function block diagram of the imprint recipe creating device according to the second embodiment.

FIG. 14 is a function block diagram realized by a CPU 110 executing an imprint recipe creating program. By execution of the imprint recipe creating program, a first creation unit 151 which creates inside-standard-shot information, a second creation unit 152 which creates a standard imprint recipe, and a third creation unit 153 which creates a correction map are realized. The standard imprint recipe and the correction map will be described later.

The first creation unit 151 creates the inside-standard-shot information by use of the filling amount information and the residual film thickness information, as does the first creation unit 111 in the above first embodiment.

The second creation unit 152 creates the standard imprint recipe by use of the inside-standard-shot information and the unevenness information. The standard imprint recipe is information (imprint recipe) indicating droplet positions of the imprint material as being a reference (being standard) in view of ones for correcting the unevenness of the substrate.

The third creation unit 153 creates the correction map by use of the unevenness distribution information and the post-process information. The correction map includes correction information indicating a corrected amount (droplet positions for correction) of the imprint material for correcting variations in unevenness of the substrate inside the wafer surface and variations in processed size in the post-process inside the wafer surface.

As shown in FIGS. 13, 14, an imprint device 200 receives the standard imprint recipe, the correction map, the shot position information and the edge information from the imprint recipe creating device 100. The imprint device 200 may previously hold the shot position information and the edge information in a storage unit (not shown).

At the time of performing each shot based on the shot position information, the imprint device 200 acquires a corrected amount corresponding to the shot position from the correction map, and adds the corrected amount to the standard imprint recipe, to correct the standard imprint recipe. The imprint device 200 then drops the imprint material based on the imprint recipe after the correction. Based on the edge information, the imprint device 200 adjusts the droplet positions in accordance with the shot position such that the imprint material is not dropped to the outside of the edge of the wafer.

In this manner, according to the present embodiment, since the imprint recipe with respect to one shot, the correction map, the shot position information and the edge information are inputted into the imprint device 200, as compared with the above first embodiment where the imprint recipe with respect to every shot is inputted into the imprint device 200, it is possible to reduce an amount of data inputted into the imprint device 200, so as to cut an overhead of the imprint process.

In the second embodiment, the correction map created by the third creation unit 153 may be a function defining a relation between the shot position and a corrected amount of droplet (correction information) of the imprint material. Representing the correction map by means of the function can further reduce the amount of data inputted into the imprint device 200.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. An imprint recipe creating device, comprising:
a first creation unit which creates inside-standard-shot information indicating droplet positions of an imprint material in a shot area corresponding to one shot of imprinting by use of filling amount information indicating an amount of the imprint material that fills depressed portions of a template and a residual film thickness information indicating a film thickness of a residual film that is formed on a substrate to be processed;
a second creation unit which creates first inside-substrate-surface information indicating droplet positions of the imprint material inside a substrate surface by use of shot position information indicating a position at which a shot of imprinting is performed inside the substrate surface, edge information indicating an edge of the substrate, and the inside-standard-shot information;
a third creation unit which creates first correction information indicating droplet positions of the imprint material for correcting unevenness generated inside the substrate surface, by use of unevenness information indicating the unevenness in a substrate of the shot area, and unevenness distribution information indicating variations in depth of the unevenness inside the substrate surface;

a fourth creation unit which creates second correction information indicating droplet positions of the imprint material for correcting variations in processing size in processing after the imprint process inside the substrate surface by use of post-process information indicating the variations in processing size;

a fifth creation unit which synthesizes the first inside-substrate-surface information, the first correction information and the second correction information, to create second inside-substrate-surface information, and a sixth creation unit which obtains a range of each shot area inside the substrate surface based on shot size information indicating a size of one shot of the imprinting and the shot position information, and carves the second inside-substrate-surface information by use of the range of each shot area, to create an imprint recipe corresponding to each shot area.

2. The imprint recipe creating device according to claim 1, wherein the second creation unit extracts a shot area as a partial shot from the shot position information and the edge information, and corrects the inside-standard-shot information with regard to the shot area as the partial shot such that the imprint material is not dropped to the outside of the edge of the substrate, to create the first inside-substrate-surface information.

3. The imprint recipe creating device according to claim 1, wherein the third creation unit creates the first correction information in which the droplet positions of the imprint material are set in positions corresponding to depressed portions inside the substrate surface.

4. An imprint device, which
receives the second inside-substrate-surface information from the imprint recipe creating device according to claim 1,
obtains a range of each shot area inside the substrate surface based on shot size information indicating a size of one shot of the imprinting and the shot position information,
carves the second inside-substrate-surface information by use of the range of each shot area, to create an imprint recipe corresponding to each shot area,
drops the imprint material onto the substrate based on the imprint recipe,
brings the template into contact with the imprint material,
applies light with the template being in the contacted state, to cure the imprint material, and
releases the template from the imprint material, to form a pattern.

* * * * *